United States Patent

Mathews et al.

Patent Number: 5,837,378
Date of Patent: Nov. 17, 1998

[54] METHOD OF REDUCING STRESS-INDUCED DEFECTS IN SILICON

[75] Inventors: Viju K. Mathews; Nanseng Jeng; Pierre C. Fazan; Thomas A. Figura, all of Boise, Id.

[73] Assignee: Micron Technology, Inc., Boise, Id.

[21] Appl. No.: 527,026

[22] Filed: Sep. 12, 1995

[51] Int. Cl.$^6$ .................................................. H01L 21/76
[52] U.S. Cl. ......................... 438/439; 438/448; 438/225; 438/297
[58] Field of Search ................................ 437/69, 70, 72, 437/73; 438/439, 448, 443, 444, 225, 297

[56] References Cited

U.S. PATENT DOCUMENTS

| | | |
|---|---|---|
| 4,125,427 | 11/1978 | Chen et al. . |
| 5,338,968 | 8/1994 | Hodges et al. ............................ 437/69 |

FOREIGN PATENT DOCUMENTS

| | | |
|---|---|---|
| 0071181 | 5/1982 | Japan . |
| 0015439 | 1/1988 | Japan . |
| 0067910 | 3/1989 | Japan . |

OTHER PUBLICATIONS

Wolf, Stanley, "Basic Isolation Process for MOS ICs (Locos Isolation)", *Silicon Processing for the VLSI Era vol. 2: Process Integration,* Lattice Press, Sunset Beach, CA, pp. 17–31, 1990.

Wolf, "Silicon Processing for The VLSI Era", vol. 2, Process Integration, Lattice Press, 1990, pp. 20–33.

*Primary Examiner*—Trung Dang
*Attorney, Agent, or Firm*—Knobbe, Martens, Olson & Bear, LLP

[57] ABSTRACT

A process for reducing stress during processing of semiconductor wafers comprising the steps of depositing a masking stack on a top and a bottom surface of the wafer and then removing at least a portion of the masking stack on the bottom surface prior to forming isolation regions on the top surface of the semiconductor wafer. In one embodiment, silicon nitride is formed on the top and the bottom surface of a silicon wafer. The silicon nitride is then patterned and etched on the top surface of the wafer to expose regions of the underlying silicon for field oxide formation. Prior to the field oxidation formation on the top side of the wafer, the silicon nitride layer on the bottom side of the wafer is removed so that a layer of silicon dioxide is formed on the bottom surface of the wafer during field oxidation formation. The layer of silicon dioxide on the bottom surface of the wafer reduces the stress in the regions of the silicon wafer adjacent the top surface of the wafer and thereby reduces the formation of stress induced defects in this region of the silicon wafer. The layer of silicon dioxide on the bottom surface of the wafer can then be removed.

13 Claims, 6 Drawing Sheets

METHOD OF REDUCING STRESS-INDUCED DEFECTS IN SILICON

FIELD OF THE INVENTION

The present invention generally concerns a method of reducing stress-induced defects in silicon and, in particular, relates to a method of reducing the stress in a silicon wafer during semiconductor processing.

BACKGROUND OF THE INVENTION

Modern day semiconductor devices operate on the principle of being able to induce known current of charge carriers through particular portions of the semiconductor device upon application of a known voltage. For example, with a pn junction, there is a predictable amount of current flow across the junction as a result of an applied voltage. This principle forms the basis of integrated circuit design in that transistors and other devices on integrated circuits can be accurately controlled by application of known voltages. However, in many semiconductor devices, there are certain defects in the semiconductor material which can result in unwanted current flow. Typically, however, the unwanted current flow resulting from these defects is generally so small so as to be negligible. However, as semiconductor devices become smaller and smaller in size, the current flow resulting from defects in the semiconductor material becomes more significant.

One particular problem that is experienced with silicon-based devices is that stress on the silicon wafer during semiconductor processing often results in stress-induced defects in the bulk silicon substrate. Basically, the processing steps involved in producing an integrated circuit on a silicon wafer often results in the silicon wafer being warped. This warpage can result in the crystalline structure of the wafer in an area adjacent the upper surface being damaged. The damage to the crystalline structure typically manifests itself as stress induced defects in the crystalline structure. These defects can result in enhanced transmission of charge carriers between energy states, resulting in greater leakage current from devices formed in the bulk silicon.

Leakage current is a particular problem with devices formed in the bulk silicon that are used to store charge carriers. One such device is a capacitor that is used with the typical DRAM memory device. In general, a DRAM memory device is comprised of a capacitor for storing charge, indicative of a data bit stored in the DRAM, and a gate device, such as a transistor, which provides access to the stored charge within the capacitor. If there are surface defects within the bulk silicon located adjacent the capacitor, a leakage current can arise which results in the stored charge of the capacitor being depleted. In fact, the leakage current of the capacitor has a very large effect on the refresh rate of the DRAM memory as a greater leakage current requires that the memory be refreshed at a greater frequency.

It is believed that some of the leakage current which depletes the charge within the capacitor of a DRAM memory stems from stress-induced defects within the bulk silicon. However, in the past this has been less of a concern for chip designers as the capacitors have generally been large enough to store enough charge so that the current resulting from stress-induced defects was negligible. However, the current trend in DRAMs, and also in semiconductor devices of all types, is to produce smaller and smaller sized devices. For example, with a 64-megabyte DRAM, the area allowed for a single cell capacitor is only about 1.4 square microns. It can be appreciated that capacitors of this size are capable of storing only a very small number of charge carriers so that the leakage current resulting from stress-induced defects can, in fact, become significant.

Hence, there is an increasing need to reduce the number of stress-induced defects in the bulk silicon of a wafer. Unfortunately, a significant portion of these stress-induced defects result from the manner in which the silicon wafer is processed. To this end, there is a further need in the prior art to develop new processing techniques which will reduce the amount of stress on a wafer during processing and, thus, reduce the number of stress induced defects contributing to leakage currents in integrated circuit devices.

SUMMARY OF THE INVENTION

The aforementioned needs are satisfied by the method of processing a semiconductor wafer of the present invention which comprises the steps of depositing a masking stack on the top and bottom sides of a semiconductor wafer, removing the masking stack off of the bottom side of the wafer, and then subsequently patterning and etching the top side of the wafer to grow isolation regions. In the prior art, the masking stack is generally grown on both the front and back sides of a silicon wafer and the masking stack on the front side of the silicon wafer is patterned and etched without the removal of the masking stack on the back side of the silicon wafer. In the prior art, it was not generally appreciated that the masking stack on the bottom side of the silicon wafer contributed to the stress-induced defects. The presence of the masking stack on the back side of the wafer results in stress being applied to the silicon wafer which increases during the field oxidation of the top side of the silicon wafer. The stress can reach a point where the total stress on the wafer produces stress-induced defects which can lead to leakage current in devices formed on the silicon wafers.

In the preferred embodiment, the process of the present invention comprises the step of growing a masking stack, preferably comprised of a pad oxide and a nitride layer, on the top and bottom sides of a silicon wafer using well-known processing techniques, and then etching substantially all of the pad oxide and nitride off of the bottom surface of the silicon wafer. Subsequently, the nitride and the pad oxide on the top surface of the silicon wafer is then patterned and etched and field oxide is grown in the patterned and etched regions. As is generally understood in the art, the pattern field oxide growth produces isolation regions isolating active areas that will contain the active devices on the silicon wafer. It will be understood, however, that during the step of growing the field oxide isolation regions on the top surface, field oxide will also typically grow on the bottom surface of the wafer due to the lack of the nitride layer. This, in some applications, will require the etching of the oxide layer grown on the bottom surface of the wafer subsequent to the field oxide isolation growth step. In further preferred embodiments, there may be additional layers, such as polysilicon, deposited on the front and back surfaces of the wafer, depending upon the requirements of a particular isolation process.

Due to the removal of the masking stack on the back side of the wafer prior to the field oxidation step, the initial stress on the bulk silicon wafer is reduced and it has been empirically demonstrated that the stress on the wafer during subsequent field oxide growth is also reduced. Hence, the overall stress on the wafer is reduced which results in fewer stress-induced defects in particularly sensitive regions of the bulk silicon, e.g., the bird's beak regions, etc., which can lessen the amount of leakage current within the bulk silicon.

It will be appreciated that, in applications such as DRAM cells having very small features, e.g., on the order of less than 1 micron, the reduction in the leakage current resulting from defects in the bulk silicon can be significant.

These and other objects and features of the present invention will become more fully apparent from the following description with reference to the accompanying drawings.

DETAILED DESCRIPTION OF THE PREFERRED EMBODIMENT

Figure 1A:
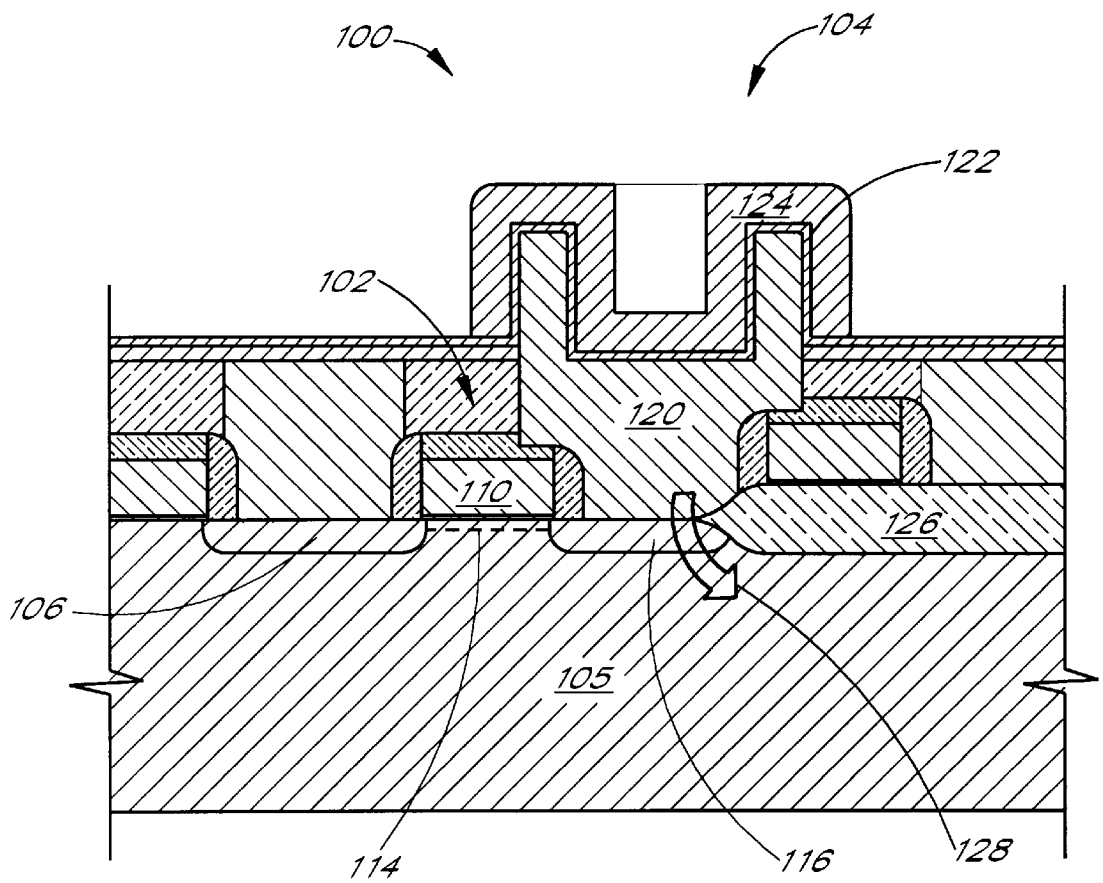
FIG. 1A is a schematic section of a DRAM storage cell on a semiconductor wafer which provides an exemplary illustration of defect-induced leakage current.
Figure 1B:
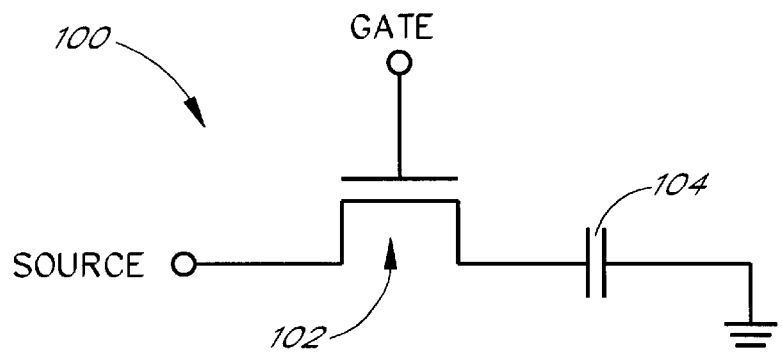
FIG. 1B is an electric schematic representation of the DRAM storage cell shown in FIG. 1A.

Reference will now be made to the numerals wherein like numerals refer to like parts throughout. Referring initially to FIGS. 1A and 1B, an exemplary prior art DRAM cell 100 is illustrated. The schematic illustrations of the DRAM cell 100 has been simplified in FIGS. 1A and 1B to facilitate an explanation of the problems associated with stress induced surface states in bulk semiconductors which can lead to increased leakage current in devices. It will, however, be understood by a person skilled in the art that the actual configuration of the capacitors and transistors implemented using the preferred embodiment of the process of the present invention may vary from the configurations shown in FIGS. 1A–1B.

As shown in FIG. 1B, the DRAM cell is generally comprised of a transistor 102 that supplies a signal to a capacitor 104. FIG. 1A more specifically illustrates how the DRAM cell is implemented on a silicon wafer. In particular, the transistor 102 is essentially comprised of a MOS-type transistor that has a doped source region 106 and a polysilicon gate 110 that is positioned over a silicon substrate 105 adjacent the doped source region. The polysilicon gate 110 is isolated from the silicon substrate 105 by a layer of oxide and application of a voltage to the polysilicon gate 110 results in an inversion layer 114 being produced in the silicon substrate 105 immediately underneath the gate. The inversion layer 114 allows charge carriers to flow from the doped source region 106 to a doped drain region 116. The capacitor 104 is formed above the doped drain region 116 so that charge carriers from the source region 106 are transmitted into a polysilicon layer 120 of the capacitor 104 to thereby charge the capacitor. The capacitor 104 is generally comprised of two layers of polysilicon 120, 124 which are separated by a layer of dielectric 122.

One particular problem that occurs in most configurations of DRAM cells of the prior art is that each DRAM cell is isolated from other circuit components on the silicon substrate by a field oxide isolation region 126. The field oxide isolation region 126 is typically grown into the silicon substrate 105 using well-known processing techniques and generally extends into the doped drain region 116 of the DRAM cell 100. Because of the volume misfit between the field oxide region 126 and silicon substrate 105, the field oxide region 126 induces stress upon the silicon crystal in the drain region 116. This induced stress can lead to the formation of stress induced defects which allow for leakage current from the capacitor 104 represented by the arrow 128 in FIG. 1A. The induced stress is further exacerbated by conventional prior art processing techniques.

The oxidation of silicon during conventional field isolation processes generally only occurs on the top surface of the wafer where the field oxidation masking stack has been patterned to expose the underlying silicon. The backside of the wafer, being completely covered with the oxidation masking stack, exerts a significant stress on the wafer which causes it to bow into a convex shape with respect to the top surface.

The stresses generated during the field oxidation process add to this stress and are a strong function of the initial built-in stress. The silicon lattice yields when the total stress increases beyond a certain critical stress and results in the generation of stress induced defects. Advanced prior art isolation techniques that use polysilicon spacers to limit encroachment further aggravate this problem due to incomplete removal of films on the backside of the wafer during subsequent processing.

Hence, prior art processes can result in an increase in the number of stress induced defects in the drain region 116. The stress induced defects in the drain region 116 can result in a greater leakage current whereby stored charge in the capacitor 104 is drawn from the capacitor electrode 120 into the substrate 105 towards the field oxide isolation region 126 thereby depleting the stored charge in the capacitor 104. The leakage current stemming from stress induced defects in the drain region 116 can result in a significant enough leakage of stored charge carriers within the capacitor 104 to affect the performance of the DRAM cell 100. The effect of the leakage current resulting from stress induced defects is, of course, accentuated where the capacitors are so small that they are storing very little charge.

Figure 2A:
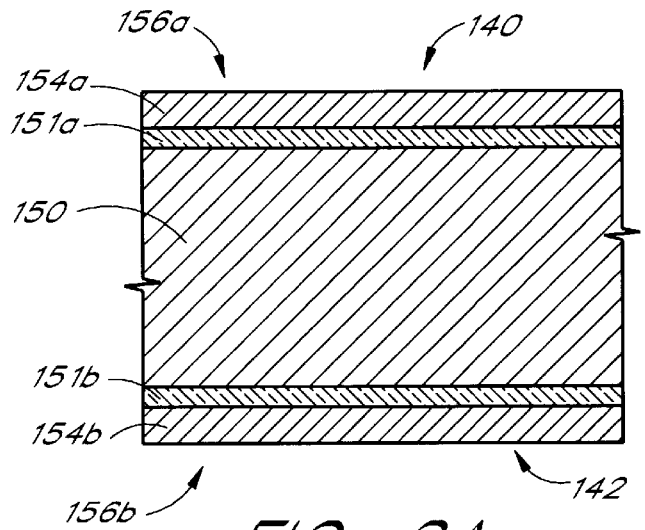
FIG. 2A is a schematic section of a silicon wafer having a masking stack grown on both the top and bottom side.

To address this problem, the processing procedures illustrated in FIGS. 2A–2G were developed. Referring initially to FIG. 2A, a pad oxide layer 151$a$, 151$b$ is grown on a silicon wafer 150 having a top side 140 and a bottom side 142 using well-known processing techniques. Typically, the pad oxide layer is a layer of silicon dioxide (SiO$_2$) on the order of 60 to 200 Å thick, grown on the silicon wafer 150 by conventional wet or dry oxidation processes. Subsequently, a nitride (Si$_3$N$_4$) layer 154a, 154b is deposited over the pad oxide layer, typically by a chemical vapor deposition process. The nitride layer 154a, 154b is typically on the order of 1500–5000 Å. The pad oxide layers 152a, 152b and the nitride layers 154a and 154b collectively comprise a masking stack 156a and 156b formed on the top and bottom surfaces of the silicon wafer 150. Generally, in the prior art, silicon wafers are prepared for further processing in the same manner as described in conjunction with FIG. 2A. The masking stack 156a on the top side 140 of the wafer 150 acts as a barrier to the growth of field oxidation layers. The masking stack 156a on the top side 140 of the wafer 150 is then patterned and etched, using well-known techniques, to expose particular regions of the underlying silicon substrate for subsequent field oxidation. It will be appreciated that the principles and processes of the present invention are applicable to other isolation processes having different or additional layers comprising the masking stack 156a, in addition to layers added onto the masking stack either before or after patterning and etching. For example, in the case of advanced isolation processes, there may also be additional layers, such as polysilicon, added to the masking stack between the pad oxide and nitride layers or over the nitride layers either before or after the patterning and etching steps. Clearly, the principles and practice of the present invention will be advantageous for reducing stress-induced defects in a plurality of isolation processes.

Figure 2B:
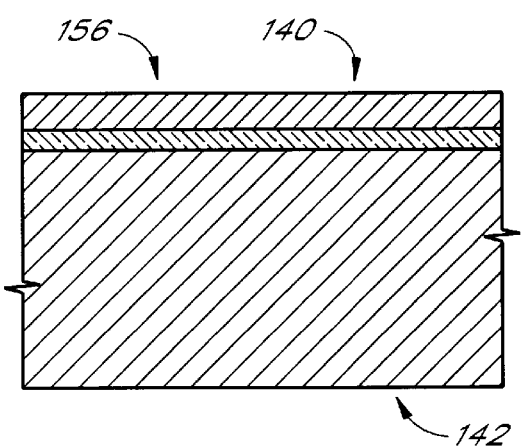
FIG. 2B is a schematic section of the silicon wafer shown in FIG. 2A wherein the masking stack on the bottom side of the wafer has been substantially removed.
Figure 2C:
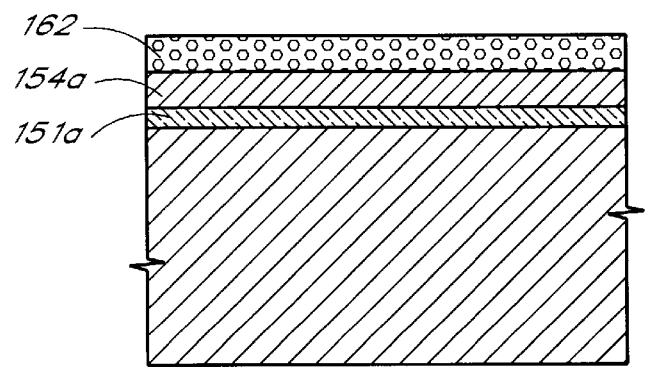
FIG. 2C is a schematic view of the wafer shown in FIG. 2B wherein a layer of photoresist has been deposited on top of the masking stack on the top surface of the wafer.

In contrast to the prior art, the process of the present invention contemplates etching, or otherwise removing the masking stack 156b comprised of the nitride layer 154b and the pad oxide layer 151b, on the bottom side 142 of the silicon wafer 150 as shown in FIG. 2B. The nitride layer 154b can be etched using well-known etching processes such as H$_3$PO$_4$ etches. As will be described in greater detail hereinbelow, etching the masking stack 156b, and, in particular, etching nitride layer 154b prior to the growth of any field oxidation isolation regions, results in significantly less initial stress being exerted on the crystalline structure of the silicon wafer 150. This further results in a decrease in the number of stress induced defects and, consequently, a decrease in the leakage current from devices such as capacitors in DRAM cells.

Figure 2D:
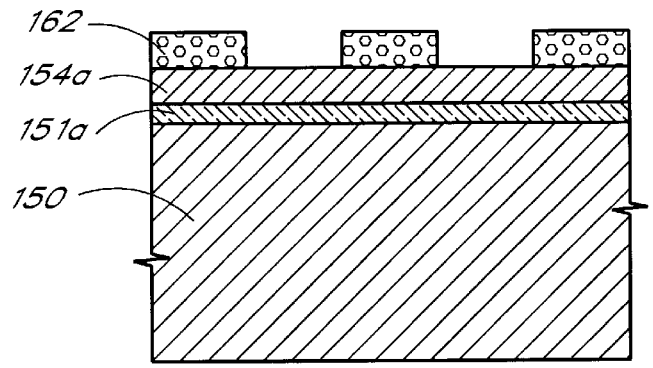
FIG. 2D is a schematic of the silicon wafer of FIG. 2C wherein the photoresist has been patterned.
Figure 2E:
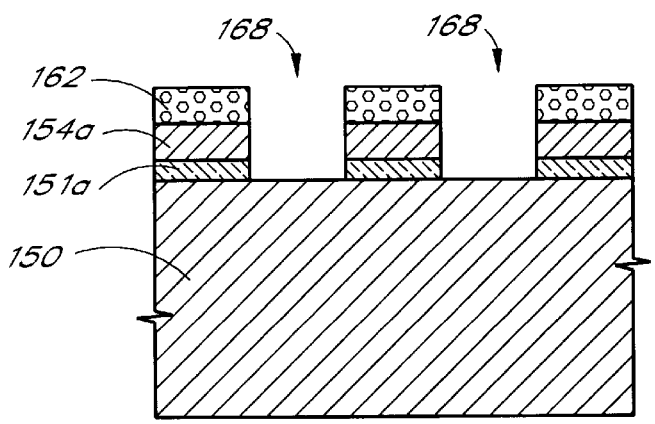
FIG. 2E is a schematic of the silicon wafer of FIG. 2D wherein the masking stack on the top side of the wafer has been etched to expose the silicon wafer.
Figure 2F:
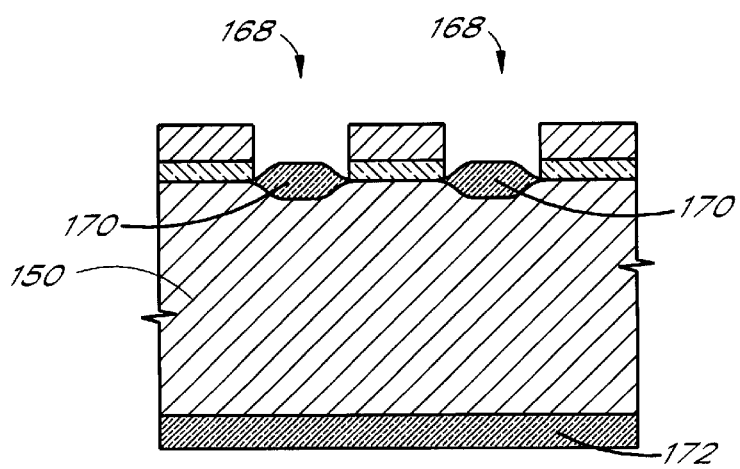
FIG. 2F is a schematic of the silicon wafer of FIG. 2E wherein field oxide isolation regions have been grown into the wafer.
Figure 2G:
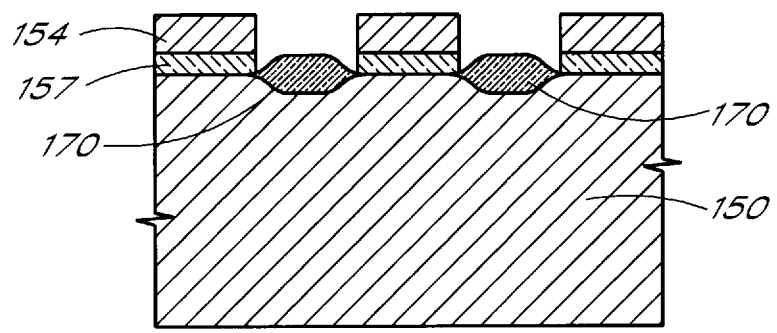
FIG. 2G is a schematic of the wafer shown in FIG. 2F wherein the field oxide on the bottom side of the wafer has been etched.

Hence, as illustrated by FIGS. 2C–2G, once the masking stack 156b is substantially removed from the bottom side 142 of the wafer 150, the top side 140 of the wafer is patterned and etched so that field oxidation isolation regions can be grown into the silicon wafer. Specifically, in one embodiment, a layer of photoresist material 162 is deposited on top of the nitride layer 154a on the top surface 140 of the wafer 150 using any of a number of well-known techniques. Subsequently, as illustrated by FIG. 2D, the photoresist layer 162 is then exposed and developed to generate the desired pattern, exposing the underlying nitride layer 154a in predetermined locations. As illustrated in FIG. 2E, the nitride and pad oxide layers 154a and 151a are then etched so as to expose one or more regions 168 in the underlying silicon substrate 105. Subsequently, as shown in FIG. 2F, the photoresist is removed and the field oxide isolation regions 170 are grown in the exposed regions 168 of the silicon wafer 150 as shown in FIG. 2F. It will be appreciated, however, that since the masking stack 156b has been removed from the bottom 142 of the silicon wafer 150, field oxidation of the exposed regions 168 of the silicon also results in the growth of a layer of silicon dioxide 172 on the bottom 142 of the silicon wafer 150. As shown in FIG. 2G, the layer of oxide 172 on the bottom side 142 of the wafer 150 can be subsequently etched using any of a number of well-known techniques. It will be appreciated, however, that it is not necessary to remove the layer of oxide 172 on the bottom side 142 of the wafer 150 immediately following the aforementioned process steps. For example, in alternative field isolation processes, the layer of oxide 172 on the bottom side 142 of the wafer 150 may be removed at a different point in the process which may be advantageous for reducing the total number of process steps.

Hence, the process of the present invention differs from well-known LOCOS processing techniques in that the masking stack 156b on the bottom side 142 of the wafer 150 is substantially removed prior to the growth of the field oxide isolation regions 170. Further, in the embodiment of the process described herein, there is the additional step of removing or otherwise reducing the layer of isolation material 172, i.e., silicon dioxide in the preferred embodiment, that covers substantially the entire bottom surface 142 of the wafer 150. In other embodiments comprising additional subsequent layers, the aforementioned process step may be carried out simultaneously with the removal of the additional layers from the wafer backside.

It will be understood that with the prior art processes, the masking stack on the bottom side of the wafer prevents the growth of the oxide layer on the bottom side of the wafer and generally exerts a compressive stresses. Furthermore, when the field isolation regions are grown on the top side of the wafer in prior art processes, the field oxidation has a tendency to exert an expansive stress on the top side of the wafer. The configuration of stresses would cause the wafer to warp in a generally convex shape, relative to the top side of the wafer. It will be appreciated by those skilled in the art that warpage of the top side of the wafer has a tendency to result in greater stress exerted on the crystalline structure of the silicon wafer 150 adjacent the top surface. It will be further understood that the subsequent growth of field oxide isolation regions increases the stress on the silicon in these regions which can ultimately result in stress induced defects. Still further, since the active devices are being formed adjacent the top surface of the wafer, the stress induced defects can occur in regions immediately adjacent the active devices thereby causing a leakage of charge carriers across the interfaces surrounding the active devices.

However, it will be understood that the process of the preferred embodiment, removing the masking stack prior to the field oxidation step, can result in field oxide being grown substantially across the entire bottom surface 142 of the wafer 150 (FIG. 2F). However, to the extent that the oxide layer on the bottom side exerts stress on the silicon wafer 150, the stress has a tendency to be compressive and thereby counteract the stress resulting from the field oxide regions grown on the top side 140 of the wafer 150. Further, as is generally understood in the art, the nitride layer 154b exerts stress on the silicon wafer 150 as a result of the interface mechanics between the nitride structure and the silicon wafer. Removal of the nitride layer 154 further reduces the initial built-in stress on the wafer 150 prior to field oxidation which further reduces the overall stress on the crystalline structure of the silicon wafer 150.

Figure 3:
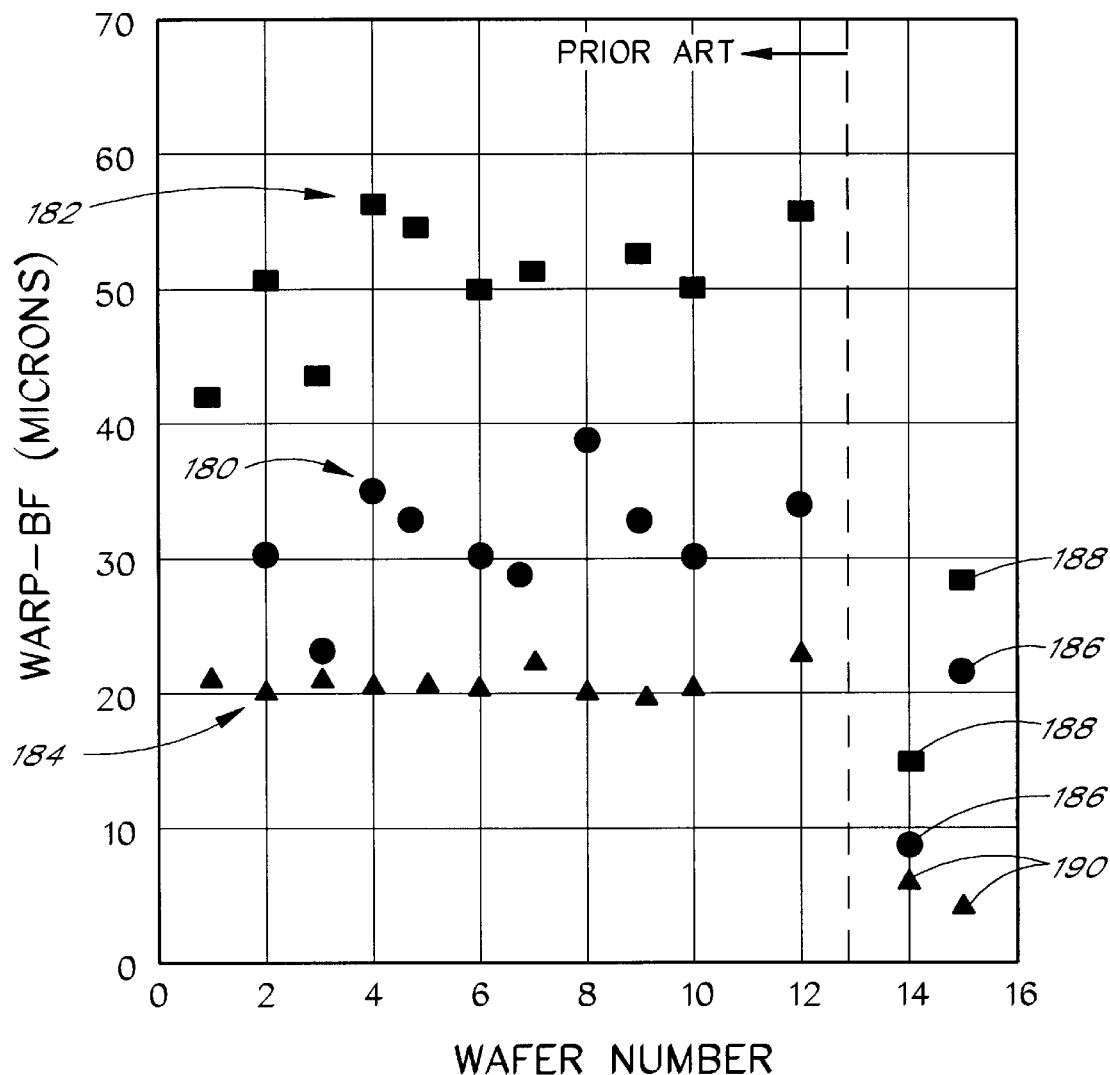
FIG. 3 is a chart illustrating the observed stress resulting from processing a plurality of wafers using a prior art process and from processing several wafers using the process illustrated in FIGS. 2A–2G.

FIG. 3, which corresponds to Table 3 reproduced hereinbelow, provides empirical evidence which further suggests that removal of the backside masking stack 156b (FIG. 2F), and, in particular, the nitride layer 154b, reduces the overall stress on the wafer 150 during processing.

TABLE 3

HIGH PRESSURE OXIDATION TEST (05713)

1000C REGULAR PROCESS

| NUMBER | PRE-OX | POST-OX | DELTA |
|---|---|---|---|
| 1 | 42.7 | 64.4 | 21.7 |
| 2 | 30.4 | 50.7 | 20.3 |
| 3 | 22.6 | 43.8 | 21.2 |
| 4 | 34 | 54.9 | 20.9 |
| 5 | 32.8 | 53.6 | 20.8 |
| 6 | 29.7 | 50.2 | 20.5 |
| 7 | 29 | 51.1 | 22.1 |
| 8 | 38.1 | 58.4 | 20.3 |
| 9 | 32.7 | 52.4 | 19.7 |
| 10 | 29.7 | 50.1 | 20.4 |
| 12 | 33.2 | 55.8 | 22.6 |
| 14 | 8.9 | 15.5 | 6.6 |
| 15 | 23.5 | 28.3 | 4.8 |

FIG. 3 and corresponding Table 3 summarize the results of warpage measured on wafers processed according to the prior art method, wherein the masking stack was not removed from the backside of the wafer, and wafers processed according to the method of the preferred embodiment, wherein the masking stack is removed from the backside of the wafer.

In these tests, the warpage of the wafers was measured prior to the field oxidation process (PRE-OX) and subsequent to the field oxidation process (POST-OX). The change in warpage was then calculated (DELTA). It will be appreciated that the warpage is indicative of the total amount of stress that is induced upon the crystalline structure of the bulk silicon comprising the wafer 150.

Summarizing the results shown in Table 3 and corresponding FIG. 3, wafers 1–12 are the wafers that were processed to have a given field oxidation pattern formed on the top surface using the prior art LOCOS method, wherein the masking stack 156b (FIG. 2a) on the bottom side of the wafer 150 was not etched. The average warpage measured for the wafers that were processed according to the prior art LOCOS method (PRE-OX, circles, 180), was 31.4375 microns. Further, the average post oxidation warpage (POST-OX, squares, 182) was 52.35 microns. These average values were calculated discounting the values for wafer number 1, 3, and 8 due to their statistical variation from the mean. The average change in warpage during field oxidation for these same wafers (DELTA, triangles, 184) was 20.9125 microns.

It can be seen that the wafers processed according to the process of the preferred embodiment (wafers 14 and 15), wherein the masking stack is removed from the backside of the wafer, have significantly lower pre-oxidation warpage (PRE-OX, circles, 186), post oxidation warpage (POST-OX, squares, 188) and change in warpage (DELTA, triangles, 190). Specifically, for wafer 14, the PRE-OX warpage was 8.9 microns, the POST-OX warpage was 15.5 microns and the DELTA was 6.6 microns. Further, for wafer 15, the PRE-OX warpage was 23.5 microns, the POST-OX warpage was 28.3 microns and the change was 4.8 microns.

Comparing the values of the PRE-OX, POST-OX and DELTA warpage for the wafers processed where the masking stack was not removed from the bottom side to the wafers processed where the masking stack was removed demonstrates that the initial stress on the wafer is significantly reduced and the increase in stress as a result of growing the field oxidation regions is also significantly reduced. While these tests were performed on a limited number of wafers, the significant decrease in the PRE-OX warpage values resulting from the removal of the masking stack suggests that the initial stress in the wafer 150 adjacent the top surface 140 (FIG. 2A) will be reduced. Further, the significant reduction in the POST-OX warpage values resulting from the removal of the masking stack further suggests that the overall stress in the wafer 150 adjacent the top surface will be reduced. The reduction of the stress in this region results in a decrease in the number of the stress induced surface states which further results in a decrease in the leakage current from devices formed in this region of the wafer 150.

Hence, the process of the preferred embodiment results in less warpage and thus less stress on the crystalline structure of the silicon wafer during LOCOS processing. This results in less stress induced defects formed in the region adjacent the upper surface of the silicon wafer in regions which will be adjacent locations where active devices will be implanted. Consequently, the leakage current through the interfaces of the active devices formed in these regions should also be reduced.

Figure 4:
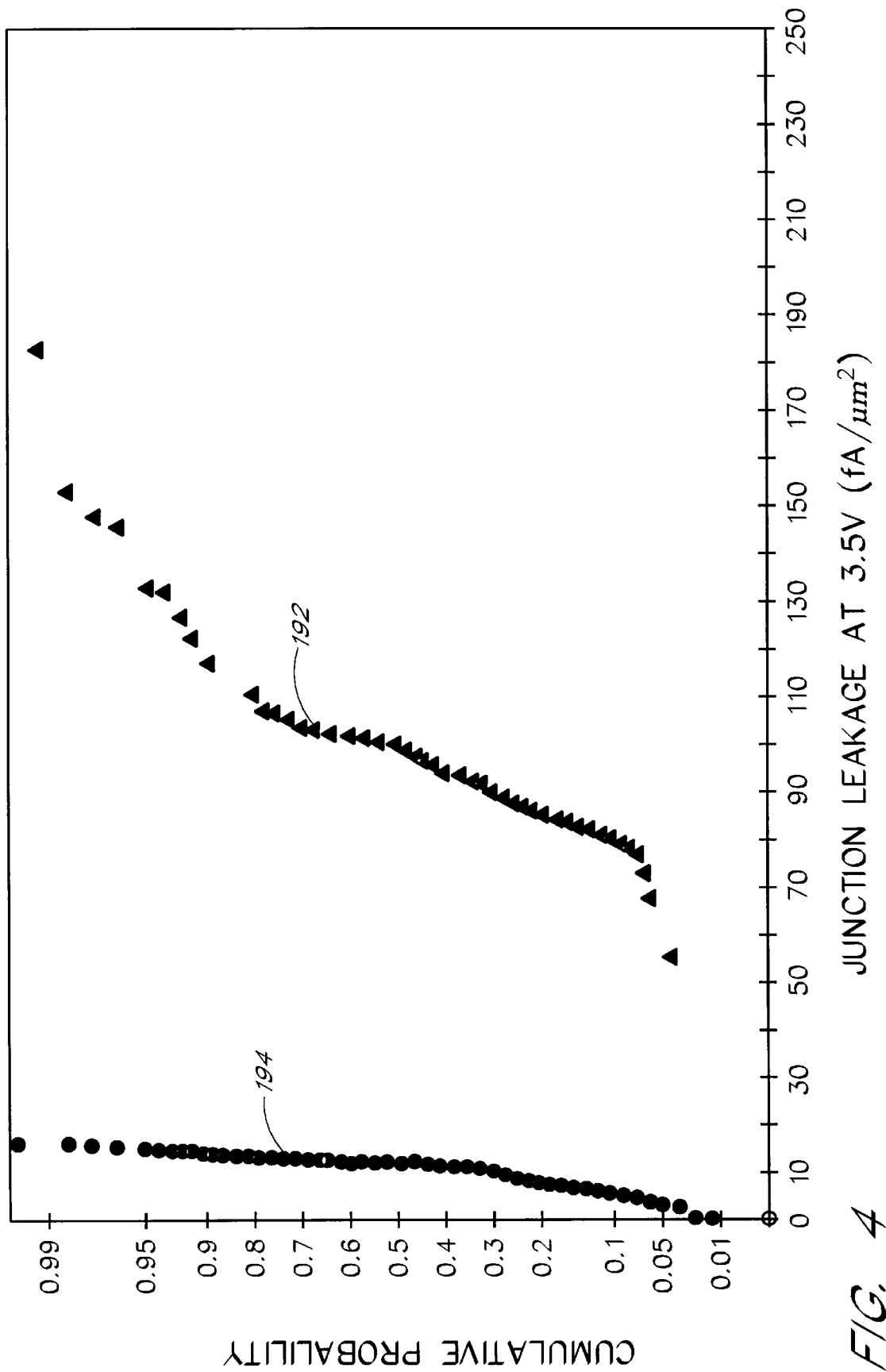
FIG. 4 is a chart illustrating the difference in leakage current experience between devices on wafers processed using prior art processing techniques and the leakage current experienced by devices on wafers processed using the process illustrated in FIGS. 2A–2G.

FIG. 4 is a graph comparing the leakage current from devices positioned on wafers prepared according to the prior art process and the leakage current from devices positioned on wafers prepared according to the process of the preferred embodiment. The wafers used in the test illustrated in FIG. 4 were processed to have the same pattern of active regions and field oxide isolation regions and the same pattern of devices were deposited in the active regions of each wafer. A plurality of measurements of the junction leakage for each wafer was measured, using well-known techniques, at a plurality of different points on each wafer. A curve 194 is representative of the cumulative probability of a particular leakage current being measured on a wafer prepared according to the process of the preferred embodiment. Similarly, a curve 192 is representative of the cumulative probability of a particular leakage current being measured on a wafer prepared according to the process of the prior art. The curve 194 indicates that the majority of the measurements of leakage current on the wafer prepared according to the process of the preferred embodiment is on the order of 10–15 femto-amps per square micron. The curve 192 indicates that the majority of measurements of leakage current on the wafer prepared according to the prior art process is on the order of 85–120 femto-amps per square micron.

Hence, a comparison of the measured leakage current values indicates that the wafer that had the masking stack on the bottom side of the wafer substantially removed prior to the field oxidation steps had measured leakage current values that were approximately ⅕ the measured leakage current values of the wafers that did not have the masking stack on the bottom side of the wafer removed prior to the field oxidation steps. Consequently, the test results shown in FIG. 4 provide empirical evidence suggesting that removing the masking stack on the bottom side of the wafer prior to growing the isolation regions on the top side of the wafer results in a significant decrease in the leakage current that will occur in active devices formed on the wafer when compared to wafers processed according to the prior art method. This is particularly significant for applications such as high density DRAM memories, wherein a decrease in the leakage current means that the capacitors will store charge for a longer period of time requiring a lower refresh rate.

It will be understood that while the process of the preferred embodiment has described a process for removing the masking stack comprised of silicon dioxide and silicon nitride on the back side of the wafer, that masking stacks used with other semiconductor processes may also be implemented without departing from the teachings of this invention. Hence, although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussion, but should be defined by the appended claims.

What is claimed is:

1. A process for reducing stress in semiconductor wafers during semiconductor processing, comprising the steps of:

forming a masking stack on a top side and a bottom side of the semiconductor wafer, the masking stack forming step comprising depositing a layer of pad oxide and a layer of silicon nitride on a top side and a bottom side of the semiconductor wafer;

removing substantially all of said masking stack on said bottom side of said semiconducting wafer, said removing step comprising removing said silicon nitride layer and said pad oxide layer from said bottom side of said semiconductor wafer; and forming subsequent to said removing step, isolation regions at selected locations on said top side of said semiconductor wafer that will isolate active areas of said semiconductor wafer.

2. The method of claim 1, wherein said step of forming isolation regions at selected locations on said top side of said semiconductor wafer comprises the steps of:

depositing a layer of photoresist material to expose one or more regions of said layer of silicon nitride on said top surface of said silicon wafer;

etching said one or more exposed regions of silicon nitride to expose one or more regions of said pad oxide;

etching said one or more exposed regions of pad oxide to expose one or more regions of said silicon wafer; and forming field oxide isolation regions in said exposed regions of said silicon wafer.

3. The process of claim 2, wherein said step of forming field oxide regions in said exposed regions of said silicon wafer comprises exposing said silicon wafer to an oxygen carrying gas in an oven so that said exposed regions of said silicon wafer are oxidized.

4. The process of claim 3, wherein said step of forming said field oxide regions in said exposed regions of said silicon wafer results in a layer of silicon dioxide being formed on the bottom surface of said silicon wafer.

5. The process of claim 4, further comprising the step of removing the layer of silicon dioxide on said bottom surface of said silicon wafer.

6. A process for producing a silicon wafer having reduced stress in regions adjacent an upper surface of said wafer, comprising the steps of forming a layer of pad oxide on the top and bottom surfaces of said silicon wafer;

depositing a layer of silicon nitride on said layer of pad oxide on the top and bottom surfaces of said silicon wafer;

etching said layers of silicon nitride and pad oxide from siad bottom surface of said wafer;

subsequent to etching said layers of silicon nitride and pad oxide from said bottom surface, forming field oxidation isolation regions on said top surface of said silicon wafer, wherein said step of forming field oxidation isolation regions results in the formation of a layer of silicon dioxide on said bottom surface of said silicon wafer and wherein said layer of silicon dioxide reduces stresses in regions of said silicon wafer adjacent said top surface resulting from said formation of field oxidation isolation regions; and removing said layer of silicon dioxide on said bottom surface of said silicon wafer.

7. The process of claim 6, further comprising depositing a polysilicon layer between the pad oxide layer and the silicon nitride layer.

8. The process of claim 6, further comprising depositing a polysilicon layer over the silicon nitride layer prior to the step of patterning and etching.

9. The process of claim 6 further comprising depositing a polysilicon layer over the silicon wafer subsequent to the step of patterning and etching.

10. The method of claim 6, wherein the step of forming field oxidation isolation regions comprises:

positioning a layer of photoresist material on said layer of silicon nitride on said top surface of said silicon wafer;

patterning and etching said layer of photoresist material to expose one or more regions of said silicon nitride;

etching said silicon nitride in said one or more exposed regions to expose one or more regions of said pad oxide;

etching said pad oxide in said one or more exposed regions to expose one or more regions of said silicon wafer; and growing field oxidation isolation regions in said one or more exposed regions of said silicon wafer.

11. The process of claim 10, wherein said step of growing field oxidation isolation regions results in active regions of said silicon wafer adjacent said top surface of said silicon wafer being electrically isolated from one another.

12. The process of claim 11, further comprising the step of forming active devices in said active regions of said silicon wafers.

13. The process of claim 12, wherein said active devices in said active regions of said silicon wafer have a reduced leakage current as a result of said step of removing said silicon nitride layer from said bottom surface of said silicon wafer.

* * * * *